United States Patent

Corbett, Jr. et al.

(10) Patent No.: US 6,749,070 B2
(45) Date of Patent: Jun. 15, 2004

(54) MODULAR STACKING EQUIPMENT RACK

(75) Inventors: Jesse Vernon Corbett, Jr., Clayton, NC (US); Alfred A. Mignacci, Raleigh, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/917,062

(22) Filed: Jul. 27, 2001

(65) Prior Publication Data

US 2003/0019823 A1 Jan. 30, 2003

(51) Int. Cl.$^7$ .................................................. A47F 7/00
(52) U.S. Cl. ...................... 211/26; 211/126.12; 211/188; 211/194; 312/223.2
(58) Field of Search ............................ 211/26, 194, 188, 211/134, 186, 153, 189, 126.1, 126.2, 126.12, 128.1, 40; 361/724, 728–730, 735; 108/33, 91, 106; 312/108, 109, 111, 257.1, 293.1, 293.3, 223.2–223.3, 223.6, 263, 265.5–265.6; 206/503, 504, 509, 724; 220/4.26–4.27, 23.6, 23.83

(56) References Cited

U.S. PATENT DOCUMENTS

| | | | | |
|---|---|---|---|---|
| 2,506,844 A | * | 5/1950 | Smith .......................... | 312/107 |
| 3,141,554 A | * | 7/1964 | Sussman et al. ......... | 211/126.4 |
| 3,234,433 A | | 2/1966 | Braunagel | |
| 3,918,781 A | * | 11/1975 | Paris ........................... | 206/504 |
| 4,690,286 A | * | 9/1987 | Horne et al. .................. | 211/26 |
| 4,852,749 A | * | 8/1989 | Fernandez et al. ....... | 211/126.2 |
| 5,247,427 A | * | 9/1993 | Driscoll et al. .............. | 211/26 |
| 5,319,524 A | * | 6/1994 | Welch et al. ................ | 361/754 |
| 5,398,159 A | * | 3/1995 | Andersson et al. ......... | 361/695 |
| 5,433,326 A | * | 7/1995 | Horian ........................ | 211/194 |
| 5,466,059 A | * | 11/1995 | Liu ........................... | 312/223.2 |
| 5,492,399 A | * | 2/1996 | Tillack ........................ | 108/91 |
| 5,540,339 A | * | 7/1996 | Lerman ....................... | 16/381 |
| 5,630,658 A | * | 5/1997 | Jeter ............................ | 108/91 |
| 5,685,439 A | * | 11/1997 | Luenser ...................... | 211/183 |
| 5,685,441 A | * | 11/1997 | Calfee ........................ | 211/194 |
| 5,701,231 A | * | 12/1997 | Do et al. .................. | 312/223.2 |
| 5,839,584 A | * | 11/1998 | Gonsalves et al. ............ | 211/26 |
| 5,906,801 A | * | 5/1999 | Goughnour .................. | 211/194 |
| 5,949,653 A | * | 9/1999 | Weng ......................... | 206/503 |
| 5,971,507 A | * | 10/1999 | Peroni ........................ | 211/26 |
| 6,007,167 A | * | 12/1999 | Cohen ...................... | 312/9.48 |
| 6,141,222 A | * | 10/2000 | Toor et al. ............... | 312/223.1 |
| 6,188,571 B1 | * | 2/2001 | Roganti et al. ............ | 361/685 |
| 6,216,894 B1 | * | 4/2001 | Hendricks .................. | 211/194 |
| 6,246,580 B1 | * | 6/2001 | Weng ......................... | 174/16.1 |
| 6,253,934 B1 | * | 7/2001 | Schroeder et al. .......... | 211/189 |
| 6,273,273 B1 | * | 8/2001 | Liao ............................ | 211/26 |

* cited by examiner

*Primary Examiner*—Jennifer E. Novosad
(74) *Attorney, Agent, or Firm*—Sawyer Law Group

(57) ABSTRACT

A system for storing equipment in a rack comprises a U-shaped enclosure having two opposing side surfaces perpendicularly coupled to a bottom surface, and an attachment element for detachably coupling the U-shaped enclosure to at least one other U-shaped enclosure to form a plurality of configurations, such that an electronic component storage rack can be constructed incrementally.

41 Claims, 6 Drawing Sheets

MODULAR STACKING EQUIPMENT RACK

FIELD OF THE INVENTION

The present invention relates to equipment storage management, and more particularly to a modular stacking rack for storing electronic equipment.

BACKGROUND OF THE INVENTION

Electronic components, such as power supplies, memory units and servers, are often stored in equipment racks. One rack usually has several shelves and holds a plurality of components stacked vertically. In general, equipment racks are produced in standard sizes, such as "head high" racks, which are approximately six feet in height, or "half high" racks, which are approximately waist high in height. Electronic components come in various sizes. For instance, the height of a component can range from "1U" to several "U's", a "U" being a unit of measure equal to 1.75 inches. Thus, a typical six foot rack could store thirteen 3U components.

A company with several hundred components could purchase a plurality of racks, and fill those racks accordingly. Nonetheless, it is inevitable that some, if not all, of the racks will be partially empty. For instance, the combined height of a group of components may be significantly less than the height of the rack, but adding another component would exceed the space allotted, or the number of components simply does not fill the rack. Shuffling or rearranging components between racks after they have been stored is tedious and time consuming because the components would have to be shut down, disconnected from other components, moved and reconnected. The down time alone could have a significant adverse effect on the company. Thus, a company would probably avoid such measures and keep the space in the racks empty.

Rack space is wasted because the sizes of the racks are standardized and not flexible. A company has no choice but to purchase a higher number of racks then would be required if the rack size was flexible. Given the cost of each rack and the floor space that each one occupies, this wasted rack space can amount to substantial monetary expenditures, as well as, inefficient use of floor space. A costly alternative would be to have custom made racks. Nevertheless, this is not a feasible alternative because a company often adds components as it grows. In other words, the number of components at one point in time will not necessary remain the same number as the company expands or contracts.

Accordingly, a need exists for a more efficient system for storing equipment in a rack. The system should offer flexible storage capacity and should be highly reliable and cost effective. The present invention fulfills this need and provides related advantages.

SUMMARY OF THE INVENTION

A system for storing equipment in a rack is disclosed. The system comprises a U-shaped enclosure having two opposing side surfaces perpendicularly coupled to a bottom surface, and an attachment element for detachably coupling the U-shaped enclosure to at least one other U-shaped enclosure to form a plurality of configurations, such that an electronic component storage rack can be constructed incrementally.

Through the aspects of the present invention, the component storage rack's height is flexible and will vary with the number of components stored. Thus, instead of buying a standard six foot high rack, which will necessarily remain partially empty, the user can buy modular segments of a rack and stack them according to the actual number of components stored. If floor space is limited, the user can stack the components to the ceiling if desired. In addition, because each enclosure is coupled to another, each enclosure can be relocated by decoupling it from its surrounding enclosure(s). Thus, moving a component(s) stored in an enclosure is less burdensome. The present invention is reliable, and relatively easy to implement given the current related technology.

DETAILED DESCRIPTION

The present invention relates to equipment storage management, and more particularly to a modular stacking rack for storing electronic equipment. The following description is presented to enable one of ordinary skill in the art to make and use the invention and is provided in the context of a patent application and its requirements. Various modifications to the preferred embodiment and the generic principles and features described herein will be readily apparent to those skilled in the art. For instance, although four enclosures are illustrated in the preferred embodiment, it is clear that any number of enclosures or even only one enclosure could be utilized. Thus, the present invention is not intended to be limited to the embodiment shown but is to be accorded the widest scope consistent with the principles and features described herein.

In accordance with a preferred embodiment of the present invention, an equipment rack is constructed incrementally using modular U-shaped enclosures. Each enclosure is adapted to couple to another enclosure either top-to-bottom, or top-to-top. Thus, if two enclosures are coupled top-to-bottom, two separate housings could accommodate components, while if the two enclosures are coupled top-to-top, a group of stacked components, or one tall component, can be stored. If the U-shaped enclosures are 3Us in height, for example, the maximum height of the opening formed by coupling two enclosures top-to-top is 6Us, and any combination of components up to a collective height of 6Us can be accommodated.

Figure 1:
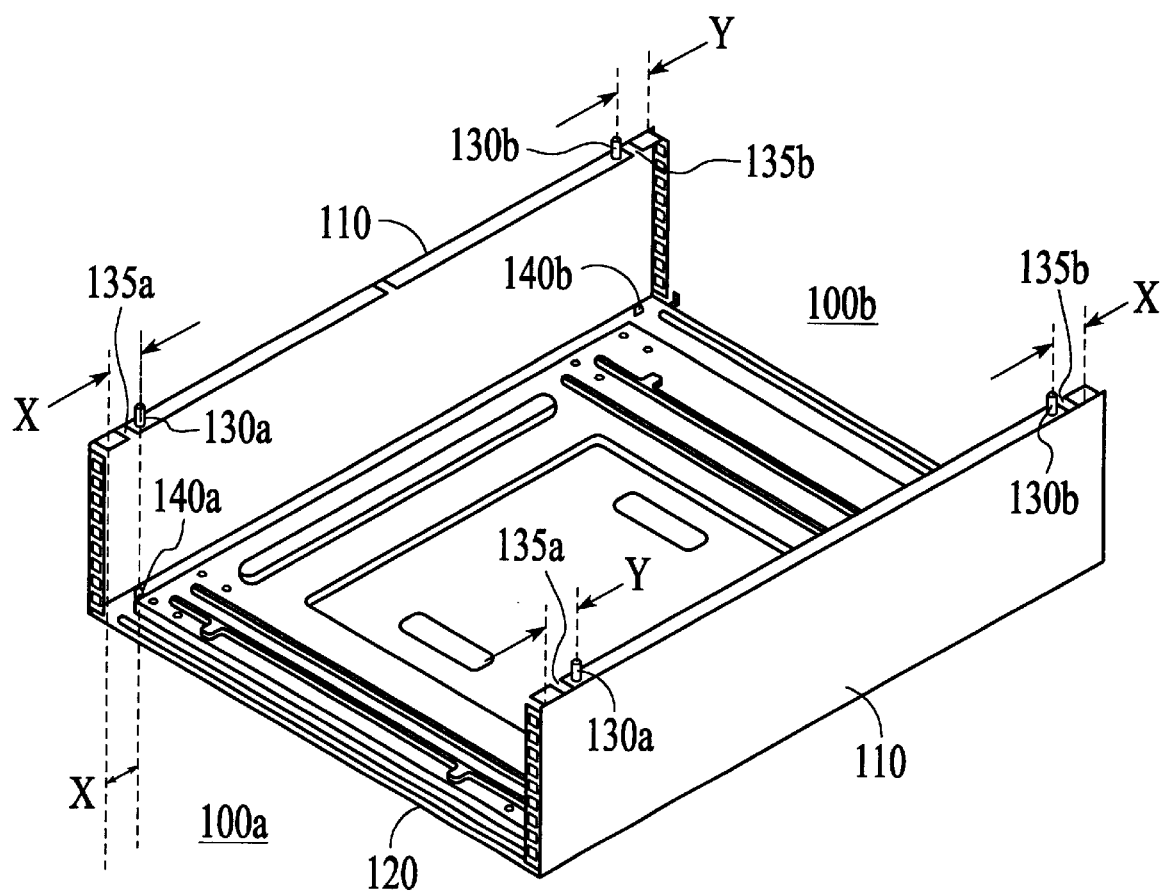
FIG. 1 illustrates one U-shaped enclosure in accordance with a preferred embodiment of the present invention.

FIG. 1 illustrates one U-shaped enclosure in accordance with a preferred embodiment of the present invention. As is shown, two side panels 110 are coupled perpendicularly to a bottom panel 120 to form the U-shaped enclosure 100. The enclosure 100 has a front 100*a* and a back 100*b*. To facilitate coupling with other U-shaped enclosures (not shown), a plurality of studs 130*a* and 130*b* are coupled to the top of the two side panels 110, which protrude in a direction perpendicular to the bottom panel 120. A front pair of studs 130a are located a distance X from the front 100a of the enclosure 100, while a back pair of studs 130b are located a distance Y from the back 100b of the enclosure 100. The distance X is not equal to the distance Y.

The bottom panel 120 includes a set of receiving holes 140a and 140b corresponding to the locations of the studs 130a and 130b. Thus, the bottom panel 120 has a pair of front receiving holes 140a located the distance X from the front 100a of the enclosure 100 and directly in line with the front pair of studs 130a, and a pair of back receiving holes 140b located the distance Y from the back 100b of the enclosure 100 and directly in line with the back pair of studs 130b. Thus, when stacking a plurality of U-shaped enclosures 100 top-to-bottom, as shown in FIG. 2B the studs 130a and 130b pass through the set of receiving holes 140a and 140b, and the U-shaped enclosures 100 form a modular stacking rack 200 having a plurality of separators 210, which define the housings for storing equipment (not shown). While the height of each U-shaped enclosure 100 is largely a design choice, preferably, the side panels 110 of each enclosure 100 are 3Us high, so that any component having a size between 1U and 3Us would fit within the space formed by the enclosure 100.

Figure 2A:
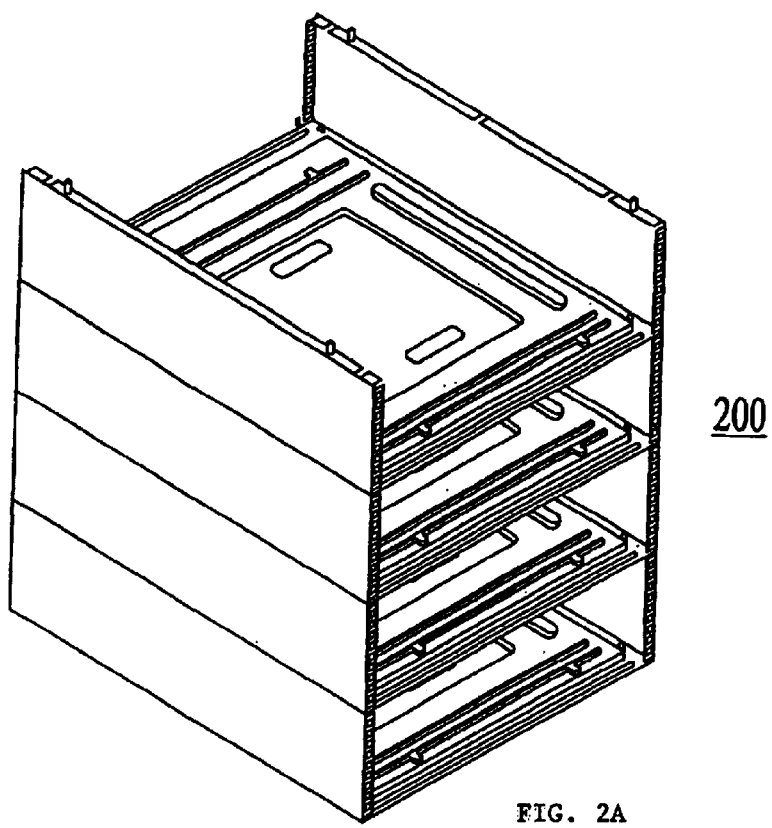
FIGS. 2A and 2B illustrate a modular stacking rack where the enclosures are stacked top to bottom in accordance with a preferred embodiment of the present invention.
Figure 2B:
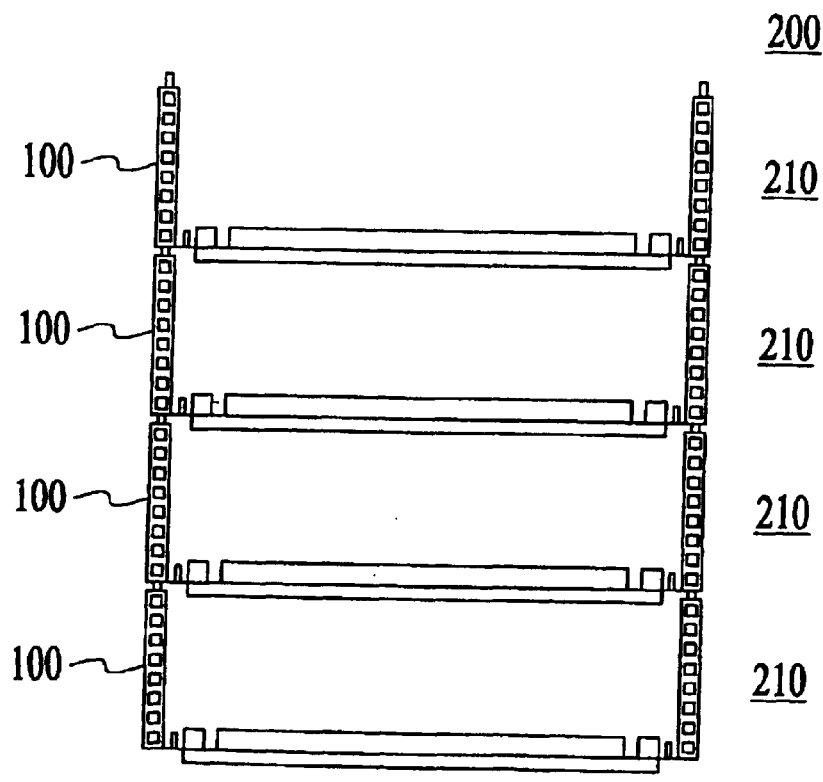
Figure 3A:
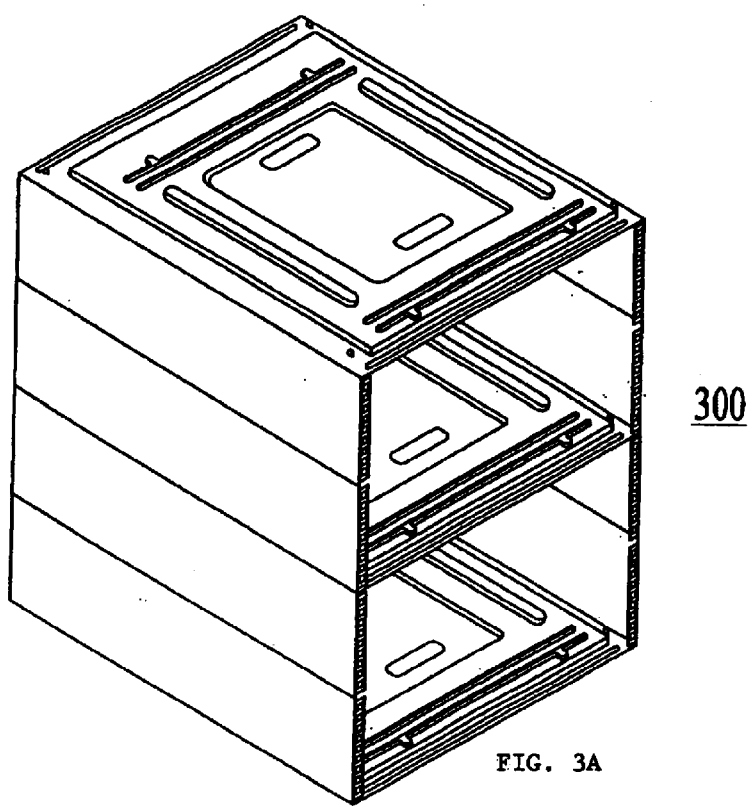
FIGS. 3A and 3B illustrates a modular stacking rack where the enclosures are stacked top to top in accordance with a preferred embodiment of the present invention.
Figure 3B:
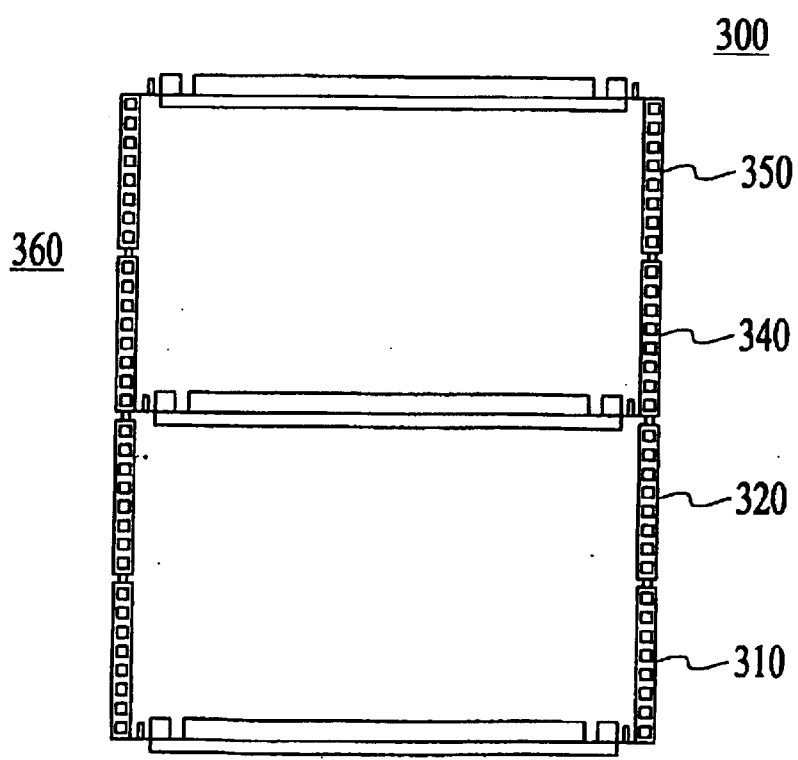

If, however, the component is larger than 3Us, for instance, if the component is 5Us high, the component will not fit in the modular stacking rack 200 illustrated in FIGS. 2A and 2B. Nevertheless, in accordance with another preferred embodiment of the present invention, the enclosures 100 can be coupled top-to-top, such that the enclosure height is double the height of the side panels 110, i.e. 6Us if the side panels 110 are 3U high, as shown in FIGS. 3A and 3B.

To understand how the enclosures 100 are adapted to form this configuration, please refer back to FIG. 1. In addition to the studs 130a and 130b, the two side panels also include a front pair of receiving slots 135a and a back pair of receiving slots 135b on the top of the side panels 110. The front pair of receiving slots 135a are located the distance Y from the front 100a of the enclosure 100, while the back pair of receiving slots 135b are located the distance X from the back 100b of the enclosure 100.

Referring back to FIG. 3B, a first enclosure 310 and a second enclosure 320 are coupled top-to-top. By aligning the front 100a of the first enclosure 310 with the back 100b of the second enclosure 320, the front pair of studs 130a of the first enclosure 310 pass through the back pair of receiving slots 135b of the second enclosure 320 because both are located the distance X from the nearest edge. The back pair of studs 130b of the first enclosure 310 pass through the front pair of receiving slots 135a of the second enclosure 320 because both are located the distance Y from the nearest edge. The inverse is true for the studs 130a and 130b of the second enclosure 320 and receiving slots 135a and 135b of the first enclosure 310. Thus, the first enclosure 310 and the second enclosure 320 are interconnected via the studs 130a and 130b and receiving slots 135a and 135b.

Figure 1A:
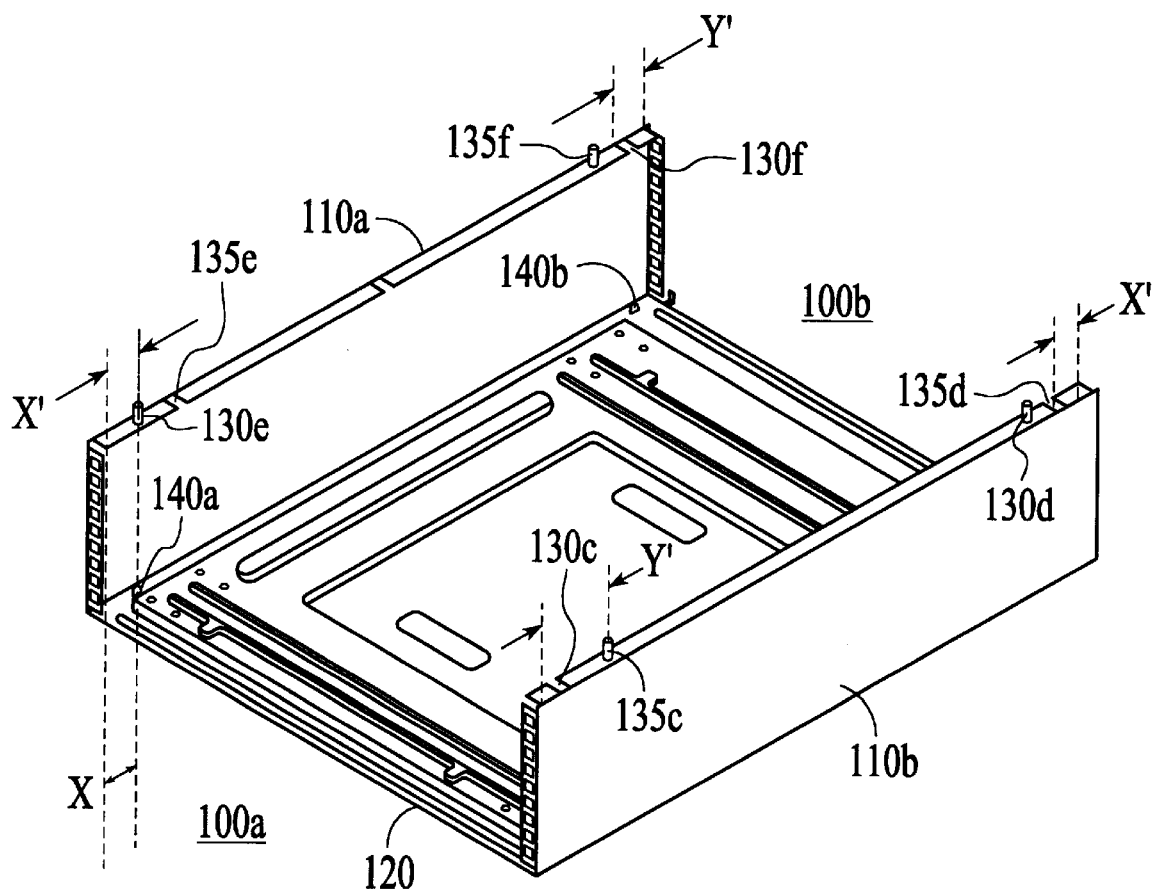
FIG. 1A illustrates a U-shaped enclosure in accordance with another preferred embodiment of the present invention.

In another embodiment, illustrated in FIG. 1A, a front stud 130e and a back stud 130f of a first side panel 110a are located a distance X' from the front 100a and back 100b, respectively, of the enclosure 100'. Similarly, a front stud 130c and a back stud 130d of a second side panel 110b are located a distance Y' from the front 100a and back 100b, respectively. The receiving slots 135e, 135f in the first side panel 110a are located the distance Y' from the front 100a and back 100b, respectively, of the enclosure 100', while the receiving slots 135c, 135d in the second side panel 110b are located the distance X' from the front 100a and back 100b, respectively.

Two enclosures 100', as described in FIG. 1A, are coupled top-to-top by aligning the top of the first side panel 110a of a first enclosure 100' with the top of the second side panel 110b of a second enclosure 100'. The studs 130e, 130f of the first enclosure's first side panel 110a pass through the receiving slots 135c, 135d of the second enclosure's 100' second side panel 110b because both are located the distance X' from the nearest edge. In a similar manner, the first enclosure's studs 130c, 130d in the second side panel 110b pass through the second enclosure's receiving slots 135e, 135f in the first side panel 110a. Thus, the configuration illustrated in FIG. 3 is achieved.

As shown in FIG. 3B, additional enclosures 340, 350 can be coupled to the second enclosure 320 to form an additional separator 360 for storing another component (not shown) or group of components (not shown). Naturally, a combination of FIGS. 2A and 3A (not shown) could create a modular stacking rack having space for up to 6U high components (FIG. 3A), as well as components 3U or less (FIG. 2A). In addition, more than two pairs of studs 130a and 130b (or 130c–130f) can be used to couple the enclosures 100 top-to-top or top-to-bottom, so long as the corresponding receiving slots 135a and 135b (or 135c–135f) are disposed appropriately to receive the studs 130a and 130b (or 130c–130f) in a top-to-top configuration, and the bottom panel 120 has the appropriate receiving holes 140a and 140b in a top-to-bottom configuration.

Figure 4:
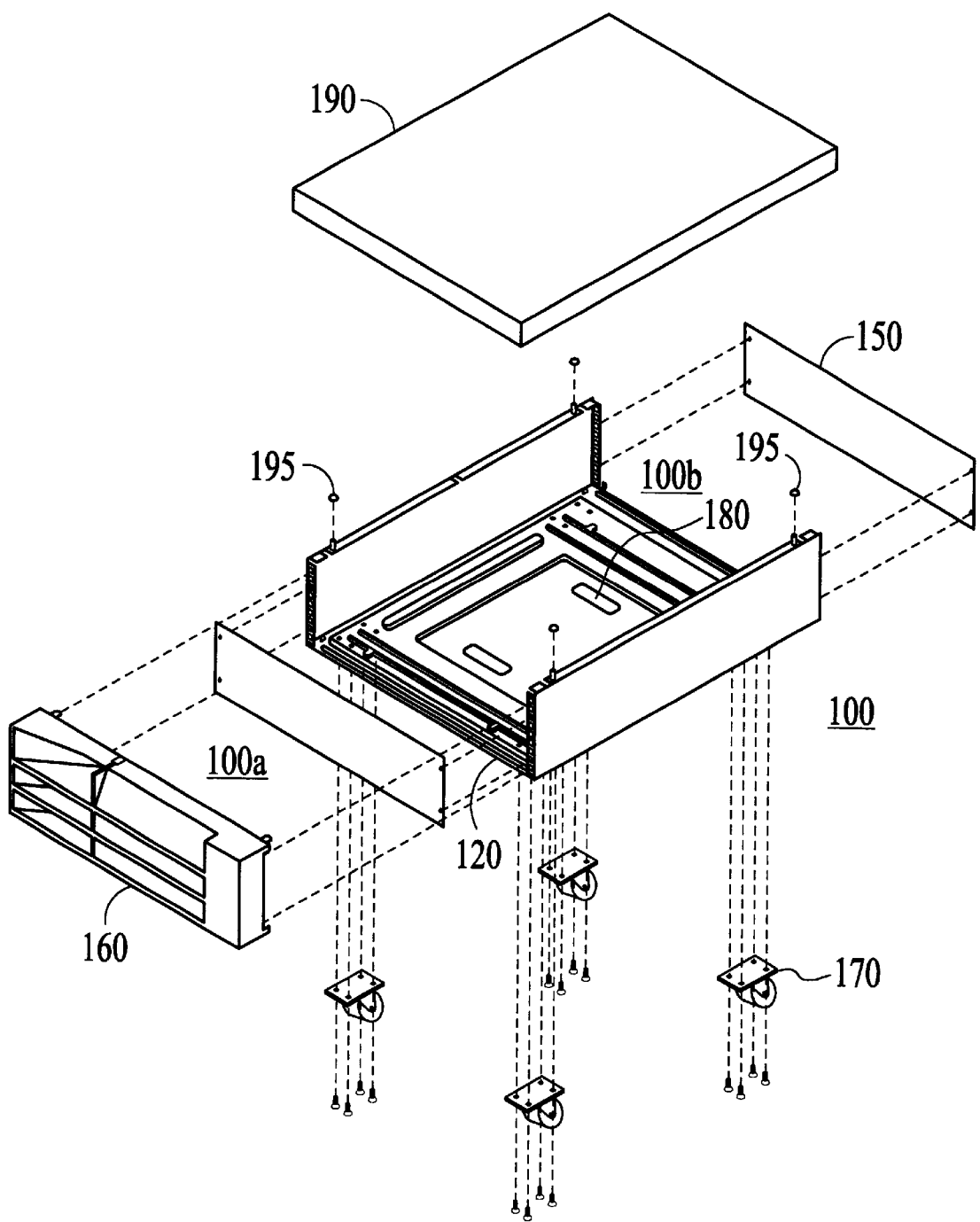
FIG. 4 is illustrates one U-shaped enclosure in accordance with a preferred embodiment of the present invention.
Figure 5:
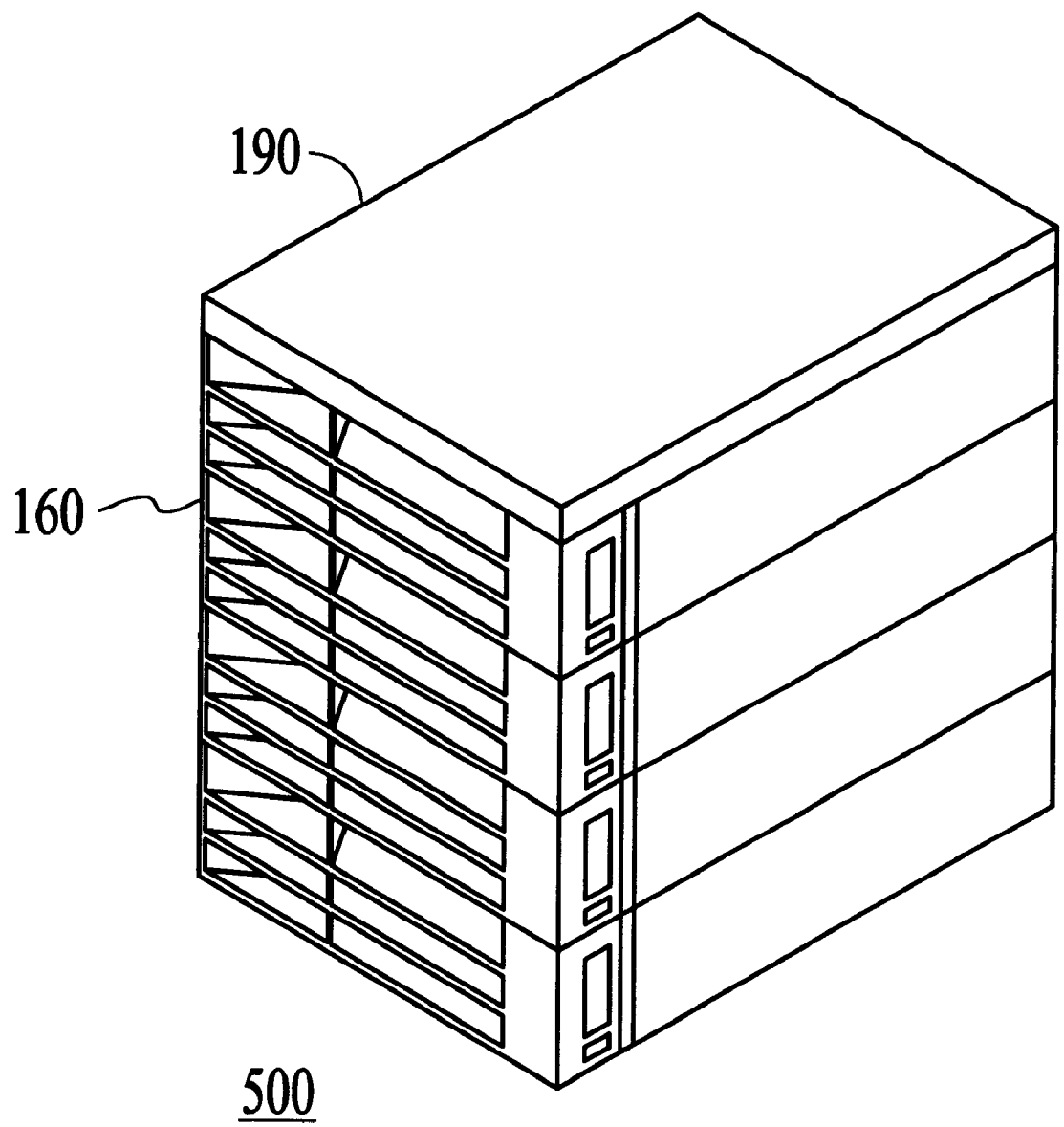
FIG. 5 is illustrates a completed modular stacking rack with bezels and a cover top attached in accordance with a preferred embodiment of the present invention.

In another preferred embodiment, the studs 130a and 130b (or 130c–130f) are threaded so that the enclosures 100 can be bolted together by nuts 195, as shown in FIG. 4. Other features of the present invention are illustrated in FIG. 4. The bottom panel 120 includes a plurality of cable port openings 180 through which connecting cables (not shown) between components can be passed. Rolling casters 170 can be coupled to the bottom of the bottommost enclosure 100 to provide mobility. To improve the aesthetic appearance of the rack, a cover plate 150 can be coupled to the back 100b of the enclosure 100, and a bezel 160 can be attached to the front 100a of the enclosure 100. The top of the completed modular stacking rack, e.g. stack rack 200, can be covered by a top cover 190. FIG. 5 illustrates a modular stacking rack 500 in accordance with the present invention with bezels 160 and the top cover 190 attached.

By utilizing the present invention, a modular stacking equipment rack can be built according to a customer's specific storage needs. By building a rack enclosure by enclosure, the customer can buy the space it needs and optimize storage capacity in the rack. The present invention is ideal for an expanding company, which may start with only a few components but grow to acquire more and more components. The flexibility and scalability of the modular stacking equipment rack of the present invention satisfies those needs, as well as others.

For instance, because the rack is modular, the task of relocating a component is simplified. Instead of physically removing the component from its shelf in the rack, which would probably entail shutting down the component, the enclosure holding the component can be decoupled from its surrounding enclosure(s) and moved to another location or stack. In some circumstances, the component can remain on while the enclosure is moved.

Although the present invention has been described in accordance with the embodiments shown, one of ordinary skill in the art will readily recognize that there could be variations to the embodiments and those variations would be within the spirit and scope of the present invention. For instance, the enclosures could be coupled using another method equivalent to that described above, or the height of the side panels can vary depending on the customer's needs. Accordingly, many modifications may be made by one of ordinary skill in the art without departing from the spirit and scope of the appended claims.

What is claimed is:

1. A system for storing at least one electronic component comprising:
   a first U-shaped enclosure having a top and a bottom and a front and a back, and having two opposing side panels perpendicularly coupled to a bottom panel;
   a second U-shaped enclosure having a top and a bottom and a front and a back, and having two opposing side panels perpendicularly coupled to a bottom panel; and
   an attachment mechanism provided on each of the first and second U-shaped enclosures, each attachment mechanism including a stud on each of the side panels of each U-shaped enclosure and a receiving hole on each of the side panels of each U-shaped enclosure, wherein, for each enclosure, the stud on one side panel is disposed a different distance from the front of the enclosure than the stud on the other side panel of that enclosure is disposed from the back of that enclosure, and, for each enclosure, the receiving hole on one side panel is disposed a different distance from the front of the enclosure than the receiving hole on the other side panel is disposed from the back of that enclosure,
   wherein the attachment mechanisms of the first and second enclosures are operative to detachably couple the first U-shaped enclosure to the second U-shaped enclosure and are adapted to allow the first U-shaped enclosure to form a plurality of coupled configurations with the second U-shaped enclosure, wherein a first configuration has the top of the first enclosure coupled to the bottom of the second enclosure, and a second configuration has the top of the first enclosure coupled to the top of the second enclosure such that the studs of the first enclosure are received by the receiving holes of the second enclosure and the studs of the second enclosure are received by the receiving holes of the first enclosure.

2. The system of claim 1, wherein the first U-shaped enclosure further comprises a cover plate coupled perpendicularly to the two side panels and the bottom panel of the first U-shaped enclosure for covering a back opening at the back of the first U-shaped enclosure.

3. The system of claim 1, wherein the first U-shaped enclosure further comprises a bezel plate coupled perpendicularly to the two side panels and the bottom panel of the first U-shaped enclosure for covering a front opening at the front of the first U-shaped enclosure.

4. The system of claim 1, wherein the first U-shaped enclosure is positioned under the second U-shaped enclosure, and the system further comprising a plurality of rolling casters coupled to the bottom panel of the first U-shaped enclosure, the rolling casters adapted to contact a supporting surface underneath the bottom panel.

5. The system of claim 1, wherein the bottom panel of the first U-shaped enclosure includes a plurality of cable port openings for allowing the passage of cables through the bottom panel.

6. The system of claim 1, wherein the studs include threaded studs and the attachment mechanisms also include a plurality of nuts corresponding to the threaded studs, the nuts being used for bolting the first U-shaped enclosure and the second U-shaped enclosure together.

7. The system of claim 1 wherein each side panel of each enclosure provides a first stud disposed a first distance from the front of the enclosure and a second stud disposed a second distance from the back of that enclosure, wherein the second distance is different from the first distance.

8. The system of claim 7 wherein each side panel of each enclosure provides a first receiving hole disposed a distance from the front of the enclosure equal to the second distance, and a second receiving hole disposed a distance from the back of the enclosure equal to the first distance.

9. The system of claim 8, wherein the attachment mechanisms include a plurality of bottom panel elements provided in the bottom panel of each of the enclosures, wherein the bottom panel elements of each enclosure correspond to the first and second studs of that enclosure.

10. The system of claim 1 of wherein on a first side panel of each enclosure, a first stud is disposed a first distance from the front of the enclosure and a second stud disposed the first distance from the back of that enclosure, and on a second side panel of each enclosure, a first stud is disposed a second distance from the front of the enclosure and a second stud disposed the second distance from the back of that enclosure, wherein the second distance is different from the first distance.

11. The system of claim 10 wherein on the first side panel of each enclosure, a first receiving hole is disposed a distance from the front of the enclosure equal to the second distance, a second receiving hole is disposed a distance from the back of the enclosure equal to the second distance, and wherein on the second side panel of each enclosure, a first receiving hole is disposed a distance from the front of the enclosure equal to the first distance, and a second receiving hole is disposed a distance from the back of the enclosure equal to the first distance.

12. The system of claim 11, wherein the attachment mechanism includes a plurality of bottom panel elements provided in the bottom panel of each of the enclosures, wherein the bottom panel elements correspond to the first and second studs.

13. A modular equipment rack comprising:
   a U-shaped enclosure having two opposing side panels coupled to a bottom panel, and wherein the U-shaped enclosure includes a top and a bottom and a front and a back; and
   a plurality of studs provided at a top of each of the two opposing side panels, the studs adapted to detachably couple the U-shaped enclosure to at least one other U-shaped enclosure in a plurality of configurations, the other U-shaped enclosure having a top and a bottom, the configurations including a first configuration having the top of one enclosure coupled to the bottom of the other enclosure, and the second configuration having the top of one enclosure coupled to the top of the other enclosure, and
   wherein on each of the two side panels, a first stud is disposed a first distance from the front of the enclosure, and a second stud is disposed a second distance from the back of the enclosure, wherein the second distance is not the same as the first distance, and
   wherein each of the two side panels further includes corresponding elements, each able to couple with or receive a corresponding one of the studs, wherein a front corresponding element is disposed a distance from the front of the enclosure equal to the second distance, and a back corresponding element is disposed a distance from the back of the enclosure equal to the first distance.

14. The rack of claim 13, wherein the bottom panel of the U-shaped enclosure includes bottom panel elements corresponding to the first and second studs.

15. The rack of claim 14, wherein the U-shaped enclosure is a first U-shaped enclosure, and the rack further comprises a second U-shaped enclosure that includes a plurality of studs and a plurality of corresponding elements, each able to couple with or receive one of the studs, wherein the plurality of corresponding elements of the first U-shaped enclosure are positioned as to be capable of receiving the first and second studs of the second U-shaped enclosure, such that when the bottom panel of the first U-shaped enclosure is placed on the two side panels of the second U-shaped enclosure, the first and second studs on the two side panels of the second U-shaped enclosure pass through or couple with the corresponding plurality of corresponding elements of the first U-shaped enclosure.

16. The rack of claim 15, wherein the first and second studs are threaded studs, and wherein the first enclosure and the second enclosure are bolted together with a plurality of nuts screwed onto the plurality of threaded studs of the second enclosure.

17. The rack of claim 14, wherein the corresponding elements of the enclosure include receiving holes for the studs, and wherein the bottom panel elements include receiving holes for the studs.

18. The rack of claim 13, wherein the front corresponding element is a front receiving slot, and wherein the back corresponding element is a back receiving slot.

19. The rack of claim 18, wherein the U-shaped enclosure is a first U-shaped enclosure, and the rack further comprises a second U-shaped enclosure that includes a plurality of studs and a plurality of corresponding receiving holes, wherein the studs of the first enclosure and the studs of the second enclosure are adapted to pass through the receiving slots of the second enclosure and the receiving slots of the first enclosure, respectively, when the first U-shaped enclosure and the second U-shaped enclosure are coupled such that the top of one enclosure is attached to the top of the other enclosure.

20. The rack of claim 19, wherein the first and second studs are threaded studs, and wherein the first enclosure and the second enclosure are bolted together with a plurality of nuts screwed onto the plurality of threaded studs of the first enclosure and the second enclosure.

21. A modular equipment rack comprising:
a U-shaped enclosure having two opposing side panels coupled to a bottom panel, and wherein the U-shaped enclosure includes a top and a bottom and a front and a back; and
a plurality of studs provided at a top of each of the two opposing side panels, the studs adapted to detachably couple the U-shaped enclosure to at least one other U-shaped enclosure in a plurality of configurations, the other U-shaped enclosure having a top and a bottom, the configurations including a first configuration having the top of one enclosure coupled to the bottom of the other enclosure, and a second configuration including the top of one enclosure coupled to the top of the other enclosure, and
wherein on one of the two side panels, a first stud is disposed a first distance from the front of the enclosure, a second stud is disposed the first distance from the back of the enclosure, a first corresponding element, able to couple with or receive the first or second stud, is disposed a second distance from the front of the enclosure, and a second corresponding element, able to couple with or receive the first or second stud, is disposed the second distance from the back of the enclosure, wherein the first distance is different from the second distance.

22. The rack of claim 21, wherein the side panel having the first and second studs and corresponding elements is a first side panel, and wherein on a second of the two side panels, a first stud is disposed the second distance from the front of the enclosure, a second stud is disposed the second distance from the back of the enclosure, a first corresponding element is disposed the first distance from the front of the enclosure, and a second corresponding element is disposed the first distance from the back of the enclosure, the first and second corresponding elements of the second side panel each able to couple with or receive a corresponding one of the studs of the first side panel.

23. The rack of claim 22, wherein the U-shaped enclosure is a first U-shaped enclosure, and the rack further comprises a second U-shaped enclosure that includes a plurality of studs and a plurality of corresponding elements, wherein the studs of the first enclosure and the studs of the second enclosure are adapted to pass through or couple with the corresponding elements of the second enclosure and the corresponding elements of the first enclosure, respectively, when the first U-shaped enclosure and the second U-shaped enclosure are coupled such that the top of one enclosure is attached to the top of the other enclosure.

24. The rack of claim 23, wherein the first and second studs are threaded studs, and wherein the first enclosure and the second enclosure are bolted together with a plurality of nuts screwed onto the plurality of threaded studs of the first enclosure and the second enclosure.

25. The rack of claim 21, wherein the bottom panel of the U-shaped enclosure includes bottom panel elements corresponding to the first and second studs.

26. The rack of claim 25, wherein the corresponding elements of the enclosure include receiving slots for the studs, and wherein the bottom panel elements include receiving holes for the studs.

27. The rack of claim 26, wherein the studs are threaded studs.

28. A method for building a modular equipment rack for storing electronic components comprising the steps of:
a) providing a U-shaped enclosure having two opposing side panels coupled to a bottom panel that couples the two side panels together, the U-shaped enclosure having a top and a bottom and a front and a back, wherein the bottom panel of the U-shaped enclosure is at the bottom of the U-shaped enclosure;
b) attaching a plurality of studs to a top of the two opposing side panels, including, on each of the two side panels, coupling a first stud a first distance from the front of the enclosure, and coupling a second stud a second distance from the back of the enclosure, wherein the second distance is not the same as the first distance, and wherein each of the side panels further includes a front corresponding element, able to receive or couple with the first or second stud, disposed a distance from the front of the enclosure equal to the second distance, and a back corresponding element, able to receive or couple with the first or second stud, disposed a distance from the back of the enclosure equal to the first distance; and
c) detachably coupling the U-shaped enclosure to at least one other U-shaped enclosure via the plurality of studs, the at least one other U-shaped enclosure having a top and a bottom, wherein the enclosures can be coupled in a plurality of configurations, the configurations including a first configuration having the top of one enclosure coupled to the bottom of the other enclosure, and a second configuration having the top of one enclosure being coupled to the top of the other enclosure.

29. The method of claim 28, wherein the bottom panel of the U-shaped enclosure includes a plurality of receiving holes corresponding to the first and second studs.

30. The method of claim 29, wherein the U-shaped enclosure is a first U-shaped enclosure, and the at least one other U-shaped enclosure is a second U-shaped enclosure that includes a plurality of threaded studs, and wherein the coupling step (c) further includes the steps of:

c1) aligning the plurality of receiving holes on the bottom panel of the first U-shaped enclosure with the plurality of threaded studs of the second U-shaped enclosure;

c2) stacking the bottom panel of the first U-shaped enclosure on top of the two side panels of the second U-shaped enclosure so that the threaded studs of the second enclosure pass through the receiving holes of the first enclosure; and c3) bolting together the first enclosure and the second enclosure by screwing a plurality of nuts onto the plurality of threaded studs of the second enclosure.

31. The method of claim 29, wherein the U-shaped enclosure is a first U-shaped enclosure and the plurality of studs are threaded studs, and the at least one other U-shaped enclosure is a second U-shaped enclosure that includes a plurality of threaded studs and a plurality of corresponding receiving slots on side panels of the second U-shaped enclosure, and wherein the coupling step (c) further comprises the steps of:

c1) aligning the first threaded stud of each side panel of the first U-shaped enclosure over a back receiving slot of each side panel of the second U-shaped enclosure, thereby aligning the second threaded stud of each side panel of the first enclosure over a front receiving slot of each side panel of the second enclosure;

c2) stacking the two side panels of the first U-shaped enclosure on top of the two side panels of the second U-shaped enclosure so that the threaded studs of the first enclosure and the threaded studs of the second enclosures pass through the receiving slots of the second enclosure and the receiving slots of the first enclosure, respectively; and c3) bolting together the first enclosure and the second enclosure by screwing a plurality of nuts onto the plurality of threaded studs of the first and second enclosures.

32. The method claim 28, wherein the corresponding elements each include at least one receiving slot.

33. The method of claim 32 further comprising the step of:

d) repeating step c) with additional U-shaped enclosures until the modular equipment rack includes a desired number of enclosures.

34. The method of claim 28, wherein the coupling step (c) further includes coupling the U-shaped enclosure to a different U-shaped enclosure, the different U-shaped enclosure having a top and a bottom, wherein the bottom of the U-shaped enclosure is coupled to a bottom of the different U-shaped enclosure.

35. A method for providing a modular equipment rack for storing at least one electronic component, the method comprising:

(a) providing first and second U-shaped enclosures, each having a top and a bottom and each having two first opposing side panels coupled to a first bottom panel, wherein first and second studs are provided on a top of each of the two opposing side panels, wherein the first stud is provided a first distance from the front of the enclosure, and the second stud is provided a second distance from the back of the enclosure, wherein the second distance is not the same as the first distance, and wherein each of the side panels further includes a front corresponding element disposed a distance from the front of the enclosure equal to the second distance, and a back corresponding element disposed a distance from the back of the enclosure equal to the first distance, wherein each of the corresponding elements is able to receive or couple with a corresponding one of the studs on the panel opposing the panel which includes that corresponding element; and (b) detachably coupling the first U-shaped enclosure to the second U-shaped enclosure using the first and second studs and corresponding elements, wherein the enclosures can be coupled in a plurality of configurations to form the rack to store the at least one electronic component, wherein the configurations include a first configuration having the first bottom panel coupled to the second opposing side panels, and a second configuration having the first opposing side panels coupled to the second opposing side panels.

36. The method of claim 35 wherein the corresponding elements include receiving holes.

37. The method of claim 35 further comprising coupling a third U-shaped enclosure to one of the first and second U-shaped enclosures to store at least one additional electronic component.

38. The method of claim 25, wherein the bottom panel of the U-shaped enclosure includes a plurality of receiving holes corresponding to the first and second studs.

39. A method for providing a modular equipment rack for storing at least one electronic component, the method comprising:

(a) providing first and second U-shaped enclosures, each having a top and a bottom and each having two first opposing side panels coupled to a first bottom panel, wherein first and second studs are provided on a top of each of the two opposing side panels, wherein on a first side panel, a first stud is disposed a first distance from the front of the enclosure, a second stud is disposed the first distance from the back of the enclosure, a front corresponding element is disposed a second distance from the front of the enclosure, and a second corresponding element is disposed the second distance from the back of the enclosure, wherein the first distance is different than the second distance, and wherein on a second side panel, a first stud is disposed the second distance from the front of the enclosure, a second stud is disposed the second distance from the back of the enclosure, a first corresponding element is disposed the first distance from the front of the enclosure, and a second corresponding element is disposed the first distance from the back of the enclosure, wherein each of the first and second corresponding elements of the first panel are able to couple with or receive a corresponding stud of the second panel, and each of the first and second corresponding elements of the second panel are able to couple with or receive a corresponding stud of the first panel; and (b) detachably coupling the first U-shaped enclosure to the second U-shaped enclosure using the first and second studs and corresponding elements of the side panels, wherein the enclosures can be coupled in a plurality of configurations to form the rack to store the at least one electronic component, wherein the configurations include a first configuration having the first bottom panel coupled to the second opposing side panels, and a second configuration having the first opposing side panels coupled to the second opposing side panels.

40. The method of claim 39, wherein the corresponding elements on the side panels are receiving holes.

41. The method of claim 40, wherein the bottom panel of each U-shaped enclosure includes a plurality of receiving holes corresponding to the first and second studs.

* * * * *